United States Patent
Kuo et al.

(10) Patent No.: US 9,013,011 B1
(45) Date of Patent: Apr. 21, 2015

(54) STACKED AND STAGGERED DIE MEMS PACKAGE AND METHOD

(75) Inventors: Bob Shih-Wei Kuo, Chandler, AZ (US); Brett Arnold Dunlap, Queen Creek, AZ (US); Louis B. Troche, Jr., Gilbert, AZ (US); Ahmer Syed, Chandler, AZ (US); Russell Shumway, Mesa, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 907 days.

(21) Appl. No.: 13/046,071

(22) Filed: Mar. 11, 2011

(51) Int. Cl.
*H01L 23/49* (2006.01)
*H01L 27/04* (2006.01)

(52) U.S. Cl.
CPC .................... *H01L 27/04* (2013.01)

(58) Field of Classification Search
USPC ............... 257/415, E29.324, 50, 52, E21.613
See application file for complete search history.

(56) References Cited

U.S. PATENT DOCUMENTS

| | | |
|---|---|---|
| 3,868,724 A | 2/1975 | Perrino |
| 3,916,434 A | 10/1975 | Garboushian |
| 4,322,778 A | 3/1982 | Barbour et al. |
| 4,525,817 A | 6/1985 | Takuya |
| 4,532,419 A | 7/1985 | Takeda |
| 4,642,160 A | 2/1987 | Burgess |
| 4,645,552 A | 2/1987 | Vitriol et al. |
| 4,685,033 A | 8/1987 | Inoue |
| 4,706,167 A | 11/1987 | Sullivan |
| 4,716,049 A | 12/1987 | Patraw |
| 4,786,952 A | 11/1988 | MacIver et al. |
| 4,806,188 A | 2/1989 | Rellick |
| 4,811,082 A | 3/1989 | Jacobs et al. |
| 4,897,338 A | 1/1990 | Spicciati et al. |
| 4,905,124 A | 2/1990 | Banjo et al. |
| 4,964,212 A | 10/1990 | Deroux-Dauphin et al. |
| 4,974,120 A | 11/1990 | Kodai et al. |
| 4,996,391 A | 2/1991 | Schmidt |

(Continued)

FOREIGN PATENT DOCUMENTS

| | | |
|---|---|---|
| JP | 05-109975 | 4/1993 |
| JP | 05-136323 | 6/1993 |

(Continued)

OTHER PUBLICATIONS

Gabriel, K., "Akustica", Sep. 29, 2005, 46 pages, Akustica, Inc., Pittsburgh, PA, USA.

(Continued)

*Primary Examiner* — Marc Armand
(74) *Attorney, Agent, or Firm* — McAndrews, Held & Malloy

(57) ABSTRACT

A staggered die MEMS package includes a substrate having a converter cavity formed therein. A converter electronic component is mounted within the converter cavity. Further, a MEMS electronic component is mounted to both the substrate and the converter electronic component in a staggered die arrangement. By staggering the MEMS electronic component directly on the converter electronic component instead of locating the MEMS electronic component in a side by side arrangement with the converter electronic component, the total package width of the staggered die MEMS package is minimized. Further, by locating the converter electronic component within the converter cavity and staggering the MEMS electronic component directly on the converter electronic component, the total package height, sometimes called Z-height, of the staggered die MEMS package is minimized.

21 Claims, 7 Drawing Sheets

(56) References Cited

U.S. PATENT DOCUMENTS

| | | |
|---|---|---|
| 5,021,047 A | 6/1991 | Movern |
| 5,072,075 A | 12/1991 | Lee et al. |
| 5,072,520 A | 12/1991 | Nelson |
| 5,081,520 A | 1/1992 | Yoshii et al. |
| 5,091,769 A | 2/1992 | Eichelberger |
| 5,108,553 A | 4/1992 | Foster et al. |
| 5,110,664 A | 5/1992 | Nakanishi et al. |
| 5,191,174 A | 3/1993 | Chang et al. |
| 5,229,550 A | 7/1993 | Bindra et al. |
| 5,239,448 A | 8/1993 | Perkins et al. |
| 5,247,429 A | 9/1993 | Iwase et al. |
| 5,250,843 A | 10/1993 | Eichelberger |
| 5,278,726 A | 1/1994 | Bernardoni et al. |
| 5,283,459 A | 2/1994 | Hirano et al. |
| 5,353,498 A | 10/1994 | Fillion et al. |
| 5,371,654 A | 12/1994 | Beaman et al. |
| 5,379,191 A | 1/1995 | Carey et al. |
| 5,404,044 A | 4/1995 | Booth et al. |
| 5,463,253 A | 10/1995 | Waki et al. |
| 5,474,957 A | 12/1995 | Urushima |
| 5,474,958 A | 12/1995 | Djennas et al. |
| 5,497,033 A | 3/1996 | Fillion et al. |
| 5,508,938 A | 4/1996 | Wheeler |
| 5,530,288 A | 6/1996 | Stone |
| 5,531,020 A | 7/1996 | Durand et al. |
| 5,546,654 A | 8/1996 | Wojnarowski et al. |
| 5,574,309 A | 11/1996 | Papapietro et al. |
| 5,581,498 A | 12/1996 | Ludwig et al. |
| 5,582,858 A | 12/1996 | Adamopoulos et al. |
| 5,616,422 A | 4/1997 | Ballard et al. |
| 5,637,832 A | 6/1997 | Danner |
| 5,674,785 A | 10/1997 | Akram et al. |
| 5,719,749 A | 2/1998 | Stopperan |
| 5,726,493 A | 3/1998 | Yamashita et al. |
| 5,739,581 A | 4/1998 | Chillara |
| 5,739,585 A | 4/1998 | Akram et al. |
| 5,739,588 A | 4/1998 | Ishida et al. |
| 5,742,479 A | 4/1998 | Asakura |
| 5,774,340 A | 6/1998 | Chang et al. |
| 5,784,259 A | 7/1998 | Asakura |
| 5,798,014 A | 8/1998 | Weber |
| 5,822,190 A | 10/1998 | Iwasaki |
| 5,826,330 A | 10/1998 | Isoda et al. |
| 5,835,355 A | 11/1998 | Dordi |
| 5,847,453 A | 12/1998 | Uematsu et al. |
| 5,883,425 A | 3/1999 | Kobayashi |
| 5,894,108 A | 4/1999 | Mostafazadeh et al. |
| 5,898,219 A | 4/1999 | Barrow |
| 5,903,052 A | 5/1999 | Chen et al. |
| 5,907,477 A | 5/1999 | Tuttle et al. |
| 5,936,843 A | 8/1999 | Ohshima et al. |
| 5,952,611 A | 9/1999 | Eng et al. |
| 6,004,619 A | 12/1999 | Dippon et al. |
| 6,013,948 A | 1/2000 | Akram et al. |
| 6,021,564 A | 2/2000 | Hanson |
| 6,028,364 A | 2/2000 | Ogino et al. |
| 6,034,427 A | 3/2000 | Lan et al. |
| 6,035,527 A | 3/2000 | Tamm |
| 6,040,622 A | 3/2000 | Wallace |
| 6,060,778 A | 5/2000 | Jeong et al. |
| 6,069,407 A | 5/2000 | Hamzehdoost |
| 6,072,243 A | 6/2000 | Nakanishi |
| 6,081,036 A | 6/2000 | Hirano et al. |
| 6,119,338 A | 9/2000 | Wang et al. |
| 6,122,171 A | 9/2000 | Akram et al. |
| 6,127,833 A | 10/2000 | Wu et al. |
| 6,160,705 A | 12/2000 | Stearns et al. |
| 6,172,419 B1 | 1/2001 | Kinsman |
| 6,175,087 B1 | 1/2001 | Keesler et al. |
| 6,184,463 B1 | 2/2001 | Panchou et al. |
| 6,194,250 B1 | 2/2001 | Melton et al. |
| 6,204,453 B1 | 3/2001 | Fallon et al. |
| 6,214,641 B1 | 4/2001 | Akram |
| 6,235,554 B1 | 5/2001 | Akram et al. |
| 6,239,485 B1 | 5/2001 | Peters et al. |
| D445,096 S | 7/2001 | Wallace |
| D446,525 S | 8/2001 | Okamoto et al. |
| 6,274,821 B1 | 8/2001 | Echigo et al. |
| 6,280,641 B1 | 8/2001 | Gaku et al. |
| 6,316,285 B1 | 11/2001 | Jiang et al. |
| 6,351,031 B1 | 2/2002 | Iijima et al. |
| 6,353,999 B1 | 3/2002 | Cheng |
| 6,365,975 B1 | 4/2002 | DiStefano et al. |
| 6,376,906 B1 | 4/2002 | Asai et al. |
| 6,392,160 B1 | 5/2002 | Andry et al. |
| 6,395,578 B1 | 5/2002 | Shin et al. |
| 6,405,431 B1 | 6/2002 | Shin et al. |
| 6,406,942 B2 | 6/2002 | Honda |
| 6,407,341 B1 | 6/2002 | Anstrom et al. |
| 6,407,930 B1 | 6/2002 | Hsu |
| 6,448,510 B1 | 9/2002 | Neftin et al. |
| 6,451,509 B2 | 9/2002 | Keesler et al. |
| 6,479,762 B2 | 11/2002 | Kusaka |
| 6,489,676 B2 | 12/2002 | Taniguchi et al. |
| 6,497,943 B1 | 12/2002 | Jimarez et al. |
| 6,517,995 B1 | 2/2003 | Jacobson et al. |
| 6,522,762 B1 | 2/2003 | Mullenborn et al. |
| 6,534,391 B1 | 3/2003 | Huemoeller et al. |
| 6,544,638 B2 | 4/2003 | Fischer et al. |
| 6,586,682 B2 | 7/2003 | Strandberg |
| 6,608,757 B1 | 8/2003 | Bhatt et al. |
| 6,660,559 B1 | 12/2003 | Huemoeller et al. |
| 6,715,204 B1 | 4/2004 | Tsukada et al. |
| 6,727,645 B2 | 4/2004 | Tsujimura et al. |
| 6,730,857 B2 | 5/2004 | Konrad et al. |
| 6,734,542 B2 | 5/2004 | Nakatani et al. |
| 6,740,964 B2 | 5/2004 | Sasaki |
| 6,753,612 B2 | 6/2004 | Adae-Amoakoh et al. |
| 6,774,748 B1 | 8/2004 | Ito et al. |
| 6,781,231 B2 | 8/2004 | Minervini |
| 6,787,443 B1 | 9/2004 | Boggs et al. |
| 6,803,528 B1 | 10/2004 | Koyanagi |
| 6,815,709 B2 | 11/2004 | Clothier et al. |
| 6,815,739 B2 | 11/2004 | Huff et al. |
| 6,838,776 B2 | 1/2005 | Leal et al. |
| 6,862,002 B2 | 3/2005 | Demicco et al. |
| 6,888,240 B2 | 5/2005 | Towle et al. |
| 6,919,514 B2 | 7/2005 | Konrad et al. |
| 6,921,968 B2 | 7/2005 | Chung |
| 6,921,975 B2 | 7/2005 | Leal et al. |
| 6,931,726 B2 | 8/2005 | Boyko et al. |
| 6,946,325 B2 | 9/2005 | Yean et al. |
| 6,953,995 B2 | 10/2005 | Farnworth et al. |
| 6,963,141 B2 | 11/2005 | Lee et al. |
| 7,015,075 B2 | 3/2006 | Fay et al. |
| 7,030,469 B2 | 4/2006 | Mahadevan et al. |
| 7,081,661 B2 | 7/2006 | Takehara et al. |
| 7,087,514 B2 | 8/2006 | Shizuno |
| 7,125,744 B2 | 10/2006 | Takehara et al. |
| 7,132,307 B2 | 11/2006 | Wang et al. |
| 7,166,910 B2 | 1/2007 | Minervini |
| 7,185,426 B1 | 3/2007 | Hiner et al. |
| 7,189,593 B2 | 3/2007 | Lee |
| 7,198,980 B2 | 4/2007 | Jiang et al. |
| 7,242,081 B1 | 7/2007 | Lee |
| 7,242,089 B2 | 7/2007 | Minervini |
| 7,282,394 B2 | 10/2007 | Cho et al. |
| 7,285,855 B2 | 10/2007 | Foong |
| 7,345,361 B2 | 3/2008 | Mallik et al. |
| 7,372,151 B1 | 5/2008 | Fan et al. |
| 7,381,589 B2 | 6/2008 | Minervini |
| 7,382,048 B2 | 6/2008 | Minervini |
| 7,420,809 B2 | 9/2008 | Lim et al. |
| 7,429,786 B2 | 9/2008 | Karnezos et al. |
| 7,434,305 B2 | 10/2008 | Minervini |
| 7,439,616 B2 | 10/2008 | Minervini |
| 7,459,202 B2 | 12/2008 | Magera et al. |
| 7,501,703 B2 | 3/2009 | Minervini |
| 7,537,964 B2 | 5/2009 | Minervini |
| 7,548,430 B1 | 6/2009 | Huemoeller et al. |
| 7,550,857 B1 | 6/2009 | Longo et al. |
| 7,633,765 B1 | 12/2009 | Scanlan et al. |
| 7,671,457 B1 | 3/2010 | Hiner et al. |
| 7,777,351 B1 | 8/2010 | Berry et al. |

(56) References Cited

U.S. PATENT DOCUMENTS

| | | |
|---|---|---|
| 7,825,520 B1 | 11/2010 | Longo et al. |
| 8,018,049 B2 | 9/2011 | Minervini |
| 2002/0017712 A1 | 2/2002 | Bessho et al. |
| 2002/0061642 A1 | 5/2002 | Haji et al. |
| 2002/0066952 A1 | 6/2002 | Taniguchi et al. |
| 2002/0195697 A1 | 12/2002 | Mess et al. |
| 2003/0025199 A1 | 2/2003 | Wu et al. |
| 2003/0035558 A1 | 2/2003 | Kawamura et al. |
| 2003/0128096 A1 | 7/2003 | Mazzochette |
| 2003/0134450 A1 | 7/2003 | Lee |
| 2003/0141582 A1 | 7/2003 | Yang et al. |
| 2003/0169575 A1* | 9/2003 | Ikuta et al. ............ 361/761 |
| 2003/0197284 A1 | 10/2003 | Khiang et al. |
| 2004/0063246 A1 | 4/2004 | Karnezos |
| 2004/0145044 A1 | 7/2004 | Sugaya et al. |
| 2004/0159462 A1 | 8/2004 | Chung |
| 2004/0184632 A1 | 9/2004 | Minervini |
| 2005/0046002 A1 | 3/2005 | Lee et al. |
| 2005/0139985 A1 | 6/2005 | Takahashi |
| 2005/0242425 A1 | 11/2005 | Leal et al. |
| 2006/0008944 A1 | 1/2006 | Shizuno |
| 2006/0157841 A1 | 7/2006 | Minervini |
| 2006/0270108 A1 | 11/2006 | Farnworth et al. |
| 2007/0082421 A1 | 4/2007 | Minervini |
| 2007/0201715 A1 | 8/2007 | Minervini |
| 2007/0202627 A1 | 8/2007 | Minervini |
| 2007/0215962 A1 | 9/2007 | Minervini et al. |
| 2007/0273049 A1 | 11/2007 | Khan et al. |
| 2007/0281471 A1 | 12/2007 | Hurwitz et al. |
| 2007/0290376 A1 | 12/2007 | Zhao et al. |
| 2008/0150111 A1 | 6/2008 | Hiller et al. |
| 2008/0230887 A1 | 9/2008 | Sun et al. |
| 2009/0057876 A1 | 3/2009 | Chien et al. |
| 2009/0115049 A1* | 5/2009 | Shiraishi et al. ............ 257/698 |
| 2010/0102428 A1* | 4/2010 | Lee et al. ............ 257/686 |
| 2010/0119097 A1 | 5/2010 | Ohtsuka |
| 2010/0221860 A1* | 9/2010 | Hawat et al. ............ 438/51 |

FOREIGN PATENT DOCUMENTS

| | | |
|---|---|---|
| JP | 07-017175 | 1/1995 |
| JP | 08-190615 | 7/1996 |
| JP | 10-334205 | 12/1998 |
| JP | 2000-307164 | 11/2000 |
| JP | 2002-057482 | 2/2002 |
| JP | 2010-187277 | 8/2010 |

OTHER PUBLICATIONS

IBM Technical Disclosure Bulletin, "Microstructure Solder Mask by Means of a Laser", vol. 36, Issue 11, p. 589, Nov. 1, 1993. (NN9311589).

Kim et al., "Application of Through Mold Via (TMV) as PoP base package" 58$^{th}$ *ECTC Proceedings*, May 2008, Lake Buena Vista, FL, 6 pages, IEEE.

Scanlan, "Package-on-package (PoP) with Through-mold Vias", *Advanced Packaging*, Jan. 2008, 3 pages, Vol. 17, Issue 1, PennWell Corporation.

"Infineon®-SMM310™ Silicon MEMS Microphone", Product Brief, 2007, 2 pages, Infineon Technologies AG, Munich, Germany. No author provided.

"Surface Mount MEMS Microphones", 2 pages. Retrieved on Apr. 28, 2010 from the Internet: <URL:http://www.knowles.com/search/product.htm?x_sub_cat_id=3>. No author provided.

Hiner et al., "Printed Wiring Motherboard Having Bonded Interconnect Redistribution Mesa", U.S. Appl. No. 10/992,371, filed Nov. 18, 2004.

Huemoeller et al., "Build Up Motherboard Fabrication Method and Structure", U.S. Appl. No. 11/824,395, filed Jun. 29, 2007.

Huemoeller et al., "Buildup Dielectric Layer Having Metallization Pattern Semiconductor Package Fabrication Method", U.S. Appl. No. 12/387,691, filed May 5, 2009.

Miller Jr. et al., "Thermal Via Heat Spreader Package and Method", U.S. Appl. No. 12/421,118, filed Apr. 9, 2009.

Scanlan et al., "Semiconductor Package Including a Top-Surface Metal Layer for Implementing Circuit Features", U.S. Appl. No. 12/589,839, filed Oct. 28, 2009.

Hiner et al., "Semiconductor Package Including Top-Surface Terminals for Mounting Another Semiconductor Package", U.S. Appl. No. 12/655,724, filed Jan. 5, 2010.

Hiner et al., "Semiconductor Package Including Top-Surface Terminals for Mounting Another Semiconductor Package", U.S. Appl. No. 12/802,661, filed Jun. 10, 2010.

Scanlan et al., "Semiconductor Package Including a Top-Surface Metal Layer for Implementing Circuit Features", U.S. Appl. No. 12/802,715, filed Jun. 10, 2010.

Syed et al., "Top Port MEMS Microphone Package and Method", U.S. Appl. No. 12/834,682, filed Jul. 12, 2010.

Scanlan, "Stacked Redistribution Layer (RDL) Die Assembly Package", U.S. Appl. No. 12/924,493, filed Sep. 27, 2010.

Miks et al., "Top Port with Interposer MEMS Microphone Package and Method", U.S. Appl. No. 13/016,343, filed Jan. 28, 2011.

Kuo et al., "Metal Mesh Lid MEMS Package and Method", U.S. Appl. No. 13/096,359, filed Apr. 28, 2011.

\* cited by examiner

STACKED AND STAGGERED DIE MEMS PACKAGE AND METHOD

TECHNICAL FIELD

The present application relates to the field of electronics, and more particularly, to methods of forming electronic component packages and related structures.

BACKGROUND

A Micro Electro Mechanical Systems (MEMS) package typically includes a MEMS sensor die, sometimes called a MEMS electronic component. As the MEMS sensor die receives external excitations such as sound waves, pneumatic pressure, or inertial force, the variations in the excitation signals are converted to electrical signals.

The MEMS sensor die is typically packaged along with an Application Specific Integrated Circuit (ASIC) into a MEMS package. The ASIC converts the signals(s) from the MEMS sensor die as required for the particular application. As the ASIC is mounted to the substrate along with the MEMS sensor die in a side by side arrangement, the resultant MEMS package is relatively large.

BRIEF DESCRIPTION OF THE DRAWINGS

In the following description, the same or similar elements are labeled with the same or similar reference numbers.

DETAILED DESCRIPTION

Figure 1:
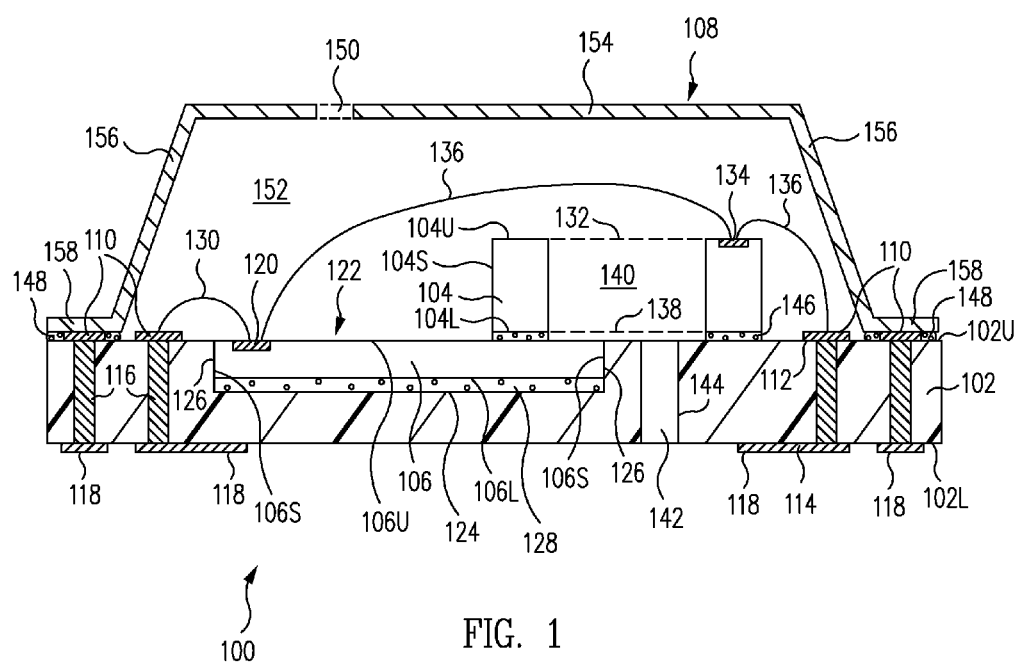
FIGS. 1 and 2 are cross-sectional views of staggered die MEMS packages in accordance with various embodiments.

As an overview and in accordance with one embodiment, referring to FIG. 1, a staggered die MEMS package 100 includes a substrate 102 having a converter cavity 122 formed therein. A converter electronic component 106 is mounted within converter cavity 122. Further, a MEMS electronic component 104 is mounted to both substrate 102 and converter electronic component 106 in a staggered die arrangement.

By staggering MEMS electronic component 104 directly on converter electronic component 106 instead of locating MEMS electronic component 104 in a side by side arrangement with converter electronic component 106, the total package width of staggered die MEMS package 100 is minimized. Stated another way, staggered die MEMS package 100 has a minimum footprint.

Further, by locating converter electronic component 106 within converter cavity 122 and staggering MEMS electronic component 104 directly on converter electronic component 106, the total package height, sometimes called Z-height, of staggered die MEMS package 100 is minimized.

Now in more detail, FIG. 1 is a cross-sectional view of a staggered die Micro Electro Mechanical Systems (MEMS) package 100 in accordance with one embodiment. Staggered die MEMS package 100 includes a substrate 102, a MEMS electronic component 104, a converter electronic component 106, and a lid 108.

Substrate 102 includes a dielectric material such as laminate, ceramic, printed circuit board material, or other dielectric material. Formed on an upper, e.g., first, surface 102U of substrate 102 are electrically conductive upper, e.g., first, terminals 110, e.g., formed of copper. Substrate 102 further includes a lower, e.g., second, surface 102L.

Substrate 102 further includes upper, e.g., first, traces 112 formed at upper surface 102U and lower, e.g., second, traces 114 formed at lower surface 102L. Lower traces 114 are electrically connected to upper traces 112 by electrically conductive vias 116 extending through substrate 102 between upper surface 102U and lower surface 102L.

Substrate 102 can further include an upper, e.g., first, solder mask at upper surface 102U that protects first portions of upper traces 112 while exposing second portions, e.g., terminals 110, of upper traces 112. Substrate 102 can further include a lower, e.g., second, solder mask at lower surface 102L that protects first portions of lower traces 114 while exposing second portions, e.g., lands 118, of lower traces 114.

In one embodiment, lands 118 are distributed in an array thus forming a Land Grid Array (LGA). Alternatively, interconnection balls, e.g., solder balls, are formed on lands 118 thus forming a Ball Grid Array (BGA).

Although a particular electrically conductive pathway is described above, other electrically conductive pathways can be formed. For example, contact metallizations can be formed between the various electrical conductors.

Further, instead of straight though vias 116, in one embodiment, substrate 102 is a multilayer substrate and a plurality of vias and/or internal traces form the electrical interconnection between upper traces 112 and lower traces 114.

Converter electronic component 106 is a conventional converter electronic component, sometimes called an Application Specific Integrated Circuit (ASIC) chip. Accordingly, the features and functions of converter electronic component 106 are well known to those of skill in the art. Thus, only a general description of various features and functions of converter electronic component 106 are set forth below. Generally, converter electronic component 106 converts the signals(s) from MEMS electronic component 104 as required for the particular application.

Converter electronic component 106 includes an active, e.g., first, surface 106U and an opposite inactive, e.g., second, surface 106L. Active surface 106U includes bond pads 120. Converter electronic component 106 further includes sides 106S extending perpendicularly between active surface 106U and inactive surface 106L. Although the terms parallel, perpendicular, and similar terms are used herein, it is to be understood that the described features may not be exactly parallel and perpendicular, but only substantially parallel and perpendicular to within accepted manufacturing tolerances.

To accommodate converter electronic component 106, substrate 102 is formed with a converter cavity 122 in upper surface 102U. Converter cavity 122 is defined by a converter cavity base 124 and converter cavity sidewalls 126. Substrate 102 is sometimes called a cavity laminate substrate.

Converter cavity base 124 is generally parallel to upper surface 102U of substrate 102. Converter cavity base 124 is between planes defined by lower surface 102L and upper surface 102U such that substrate 102 remains between converter cavity base 124 and lower surface 102L.

Converter cavity sidewalls 126 extend perpendicularly between converter cavity base 124 and upper surface 102U of substrate 102.

In accordance with this embodiment, converter electronic component 106 is mounted within converter cavity 122 in a wire bond configuration. More particularly, inactive surface 106L is mounted to converter cavity base 124, e.g., by an adhesive 128.

The depth of converter cavity 122, i.e., the height of converter cavity sidewalls 126, is equal to the thickness of converter electronic component 106 between active surface 106U and inactive surface 106L including adhesive 128 (the thickness of adhesive 128 is generally negligible). Accordingly, active surface 106U of converter electronic component 106 is parallel to and coplanar with upper surface 102U of substrate 102. Stated another way, converter electronic component 106 is embedded within substrate 102. Although various features may be described as being equal or coplanar, in light of this disclosure, those of skill in the art will understand that the features may not be exactly equal or coplanar but only substantially equal or coplanar to within accepted manufacturing tolerances.

Further, the width of converter cavity 122, i.e., the distance between opposite converter cavity sidewalls 126, is equal to or slightly greater than the width of converter electronic component 106, i.e., the distance between opposite sides 106S. Accordingly, converter cavity 122 is the same size or slightly greater than converter electronic component 106 allowing converter electronic component 106 to be mounted within converter cavity 122.

Bond pads 120 of converter electronic component 106 are electrically connected to respective terminals 110 with electrically conductive bond wires 130.

MEMS electronic component 104 is a conventional MEMS microphone electronic component, sometimes called a MEMS chip. Accordingly, the features and functions of MEMS electronic component 104 are well known to those of skill in the art. Thus, only a general description of various features and functions of MEMS electronic component 104 are set forth below. In this embodiment, MEMS electronic component 104 is an acoustical microphone.

MEMS electronic component 104 includes a lower, e.g., first, surface 104L and an opposite upper, e.g., second, surface 104U. MEMS electronic component 104 further includes sides 104S extending perpendicularly between upper surface 104U and lower surface 104L.

MEMS electronic component 104 further includes a moveable compliant diaphragm 132 and bond pads 134 formed at upper surface 104U. Bond pads 134 are electrically connected to respective terminals 110 with electrically conductive bond wires 136.

Optionally, one or more of bond pads 134 of MEMS electronic component 104 are electrically connected to respective one or more bond pads 120 of converter electronic component 106 with bond wires 136. Accordingly, bond pads 134 of MEMS electronic component 104 are electrically connected to respective terminals 110, to respective bond pads 120 of converter electronic component 106, or to both respective terminals 110 and respective bond pads 120 of converter electronic component 106.

MEMS electronic component 104 further includes a rigid perforated backplate 138 at lower surface 104L. MEMS electronic component 104 further includes an aperture 140 extending through MEMS electronic component 104 and between upper surface 104U and lower surface 104L. More particularly, aperture 140 extends between and separates diaphragm 132 and backplate 138 such that diaphragm 132 and backplate 138 form a capacitor.

As described further below, during operation, sound waves move diaphragm 132 thus causing changes in the capacitance between diaphragm 132 and backplate 138. An electrical signal corresponding to the capacitance variations is output on bond pads 134.

Substrate 102 further includes an optional bottom port 142. Bottom port 142 is an aperture, sometimes called opening or hole, extending through substrate 102 between lower surface 102L and upper surface 102U. Bottom port 142 is defined by a bottom port sidewall 144, e.g., a cylindrical sidewall, extending through substrate 102 between lower surface 102L and upper surface 102U. Bottom port 142 is located adjacent to converter cavity 122. By forming bottom port 142 in substrate 102, formation of a through hole in converter electronic component 106 is avoided.

MEMS electronic component 104 is mounted to both substrate 102 and converter electronic component 106 in a staggered die arrangement. More particularly, lower surface 104L of MEMS electronic component 104 is mounted to upper surface 102U of substrate 102 and active surface 106U of converter electronic component 106, e.g., with an adhesive 146.

By staggering MEMS electronic component 104 directly on converter electronic component 106 instead of locating MEMS electronic component 104 in a side by side arrangement with converter electronic component 106, the total package width of staggered die MEMS package 100 is minimized. Stated another way, staggered die MEMS package 100 has a minimum footprint. Further, by locating converter electronic component 106 within converter cavity 122 and staggering MEMS electronic component 104 directly on converter electronic component 106, the total package height, sometimes called Z-height, of staggered die MEMS package 100 is minimized.

MEMS electronic component 104 is mounted to substrate 102 above bottom port 142. More particularly, bottom port 142 is in fluid communication with aperture 140 of MEMS electronic component 104. Accordingly, during use, sound travels through bottom port 142 and aperture 140 and moves diaphragm 132. As described above, the motion of diaphragm 132 from the sound is converted into an electrical signal that is output on bond pads 134.

Lid 108 is mounted to upper surface 102U of substrate 102 with a lid adhesive 148. In one embodiment, lid 108 is or includes an electrically conductive material to provide Radio Frequency (RF) shielding or more generally to provide shielding from ElectroMagnetic Interference (EMI).

In accordance with this embodiment, lid adhesive 148 is electrically conductive, e.g., is an electrically conductive epoxy, solder, or other electrically conductive adhesive. Lid 108 is mounted to and electrically connected by lid adhesive 148 to terminals 110. In one embodiment, a reference voltage source, e.g., ground, is provided to terminals 110 and thus lid 108.

However, in another embodiment where EMI shielding is not required or desired, lid 150 and lid adhesive 148 are non-conductive and are not electrically connected to terminals 110 or to a reference voltage source such as vias 116 connected to ground.

Lid 108 further includes an optional top port 150. Top port 150 is an aperture, sometimes called opening or hole, extending through lid 108. More particularly, top port 150 is in fluid communication with a lid cavity 152 of lid 108 and thus diaphragm 132 of MEMS electronic component 104. Accordingly, during use, sound travels through top port 150 and lid cavity 152 and moves diaphragm 132. As described above, the motion of diaphragm 132 from the sound is converted into an electrical signal that is output on bond pads 134.

Although both a bottom port 142 and a top port 150 are described above, in another embodiment, staggered die MEMS package 100 includes either bottom port 142 or top port 150, but not both. Bottom port 142 and aperture 140 are acoustically sealed from top port 150 and lid cavity 152 across diaphragm 132.

Although MEMS electronic component 104 is described above as a MEMS microphone, in other embodiments, MEMS electronic component 104 is another type of MEMS device. For example, MEMS electronic component 104 is a pressure sensor or other MEMS electronic component where access to the ambient environment is required or desired.

In accordance with one embodiment, MEMS electronic component 104 is a pressure sensor. In accordance with this embodiment, staggered die MEMS package 100 includes: (1) bottom port 142; (2) top port 150; or (3) bottom port 142 and top port 150. For example, where differential pressure between bottom port 142 and top port 150 is to be measured by MEMS electronic component 104, staggered die MEMS package 100 includes both bottom port 142 and top port 150.

As set forth, lid 108 includes a lid cavity 152. More particularly, lid 108 includes a lid plate 154 having top port 150 formed therein, lid sidewalls 156 extending downwards from lid plate 154, and lid base 158 at the lower surfaces of sidewalls 156. Lid base 158 is mounted to substrate 102 and optionally, terminals 110, with lid adhesive 148.

Figure 2:
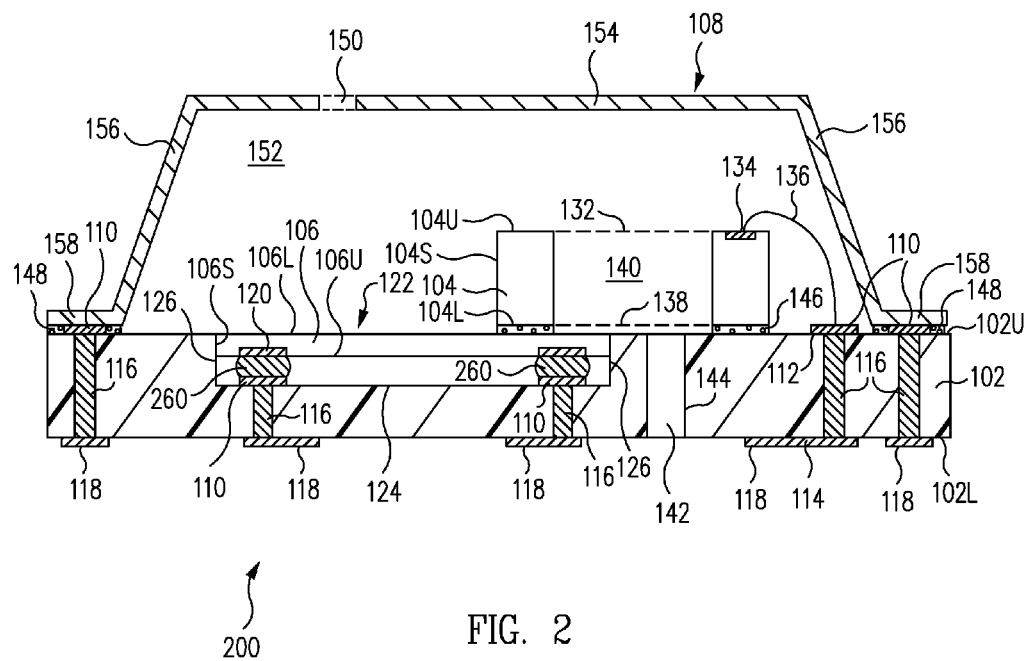

FIG. 2 is cross-sectional view of a staggered die MEMS package 200 in accordance with another embodiment. Staggered die MEMS package 200 of FIG. 2 is similar to staggered die MEMS package 100 of FIG. 1 and only the significant differences are discussed below.

Referring now FIG. 2, in accordance with this embodiment, terminals 110 are additionally formed on converter cavity base 124. Further, converter electronic component 106 is mounted within converter cavity 122 in a flip chip configuration.

Illustratively, flip chip bumps 260, e.g., solder, copper, gold or other electrically conductive material, forms the physical and electrical interconnection between bond pads 120 of converter electronic component 106 and terminals 110. Optionally, an underfill is applied between converter electronic component 106 and converter cavity base 124.

The depth of converter cavity 122, i.e., the height of converter cavity sidewalls 126, is equal to the thickness of converter electronic component 106 between active surface 106U and inactive surface 106L and the height of flip chip bumps 260. Accordingly, inactive surface 106L of converter electronic component 106 is parallel to and coplanar with upper surface 102U of substrate 102.

Further, the width of converter cavity 122, i.e., the distance between opposite converter cavity sidewalls 126, is equal to or slightly greater than the width of converter electronic component 106, i.e., the distance between opposite sides 106S. Accordingly, converter cavity 122 is the same size or slightly greater than converter electronic component 106 allowing converter electronic component 106 to be mounted within converter cavity 122.

MEMS electronic component 104 is mounted to both substrate 102 and converter electronic component 106 in a staggered die arrangement. More particularly, lower surface 104L of MEMS electronic component 104 is mounted to upper surface 102U of substrate 102 and inactive surface 106L of converter electronic component 106, e.g., with adhesive 146.

Figure 3:
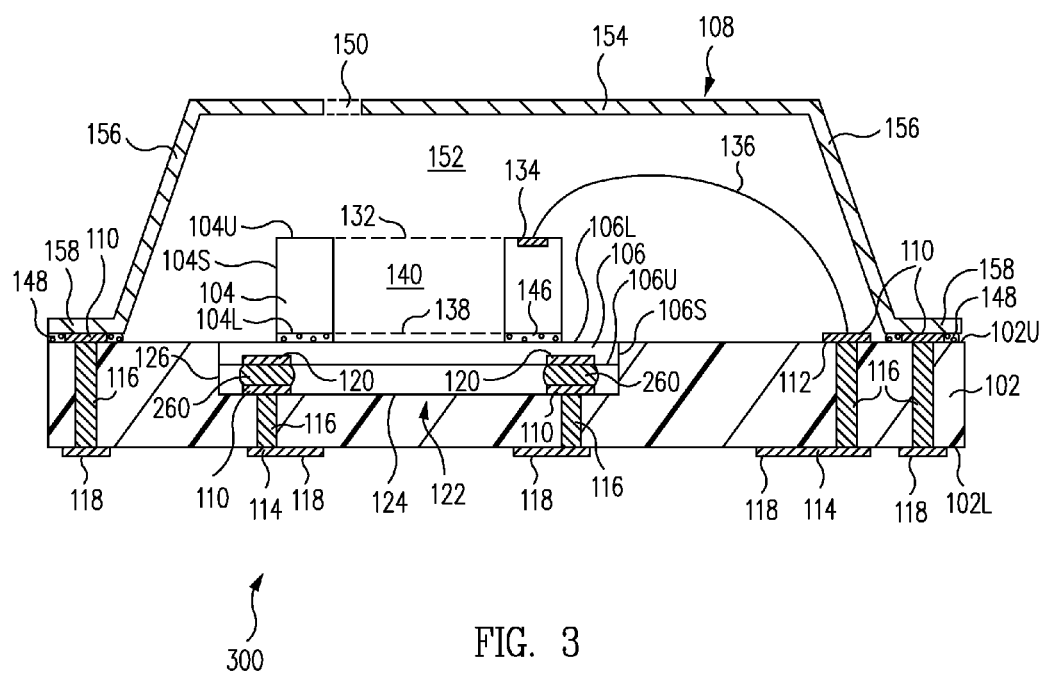
FIGS. 3 and 4 are cross-sectional views of stacked die MEMS packages in accordance with various embodiments.

FIG. 3 is cross-sectional view of a stacked die MEMS package 300 in accordance with another embodiment. Stacked die MEMS package 300 of FIG. 3 is similar to staggered die MEMS package 200 of FIG. 2 and only the significant differences are discussed below.

Referring now to FIG. 3, in accordance with this embodiment, MEMS electronic component 104 is mounted only to converter electronic component 106 in a stacked die arrangement. More particularly, lower surface 104L of MEMS electronic component 104 is mounted to inactive surface 106L of converter electronic component 106, e.g., with adhesive 146.

Further, substrate 102 is formed without bottom port 142. Optionally, lid 108 is formed with top port 150.

However, in another embodiment where access to the ambient environment is not necessary or desired, lid 108 is formed without top port 150 such that lid cavity 152 is a sealed cavity that is sealed from the ambient environment. For example, MEMS electronic component 104 is an inertial sensor such as an accelerometer, a gyroscope, or other MEMS device that does not require access to the ambient environment for proper operation.

Figure 4:
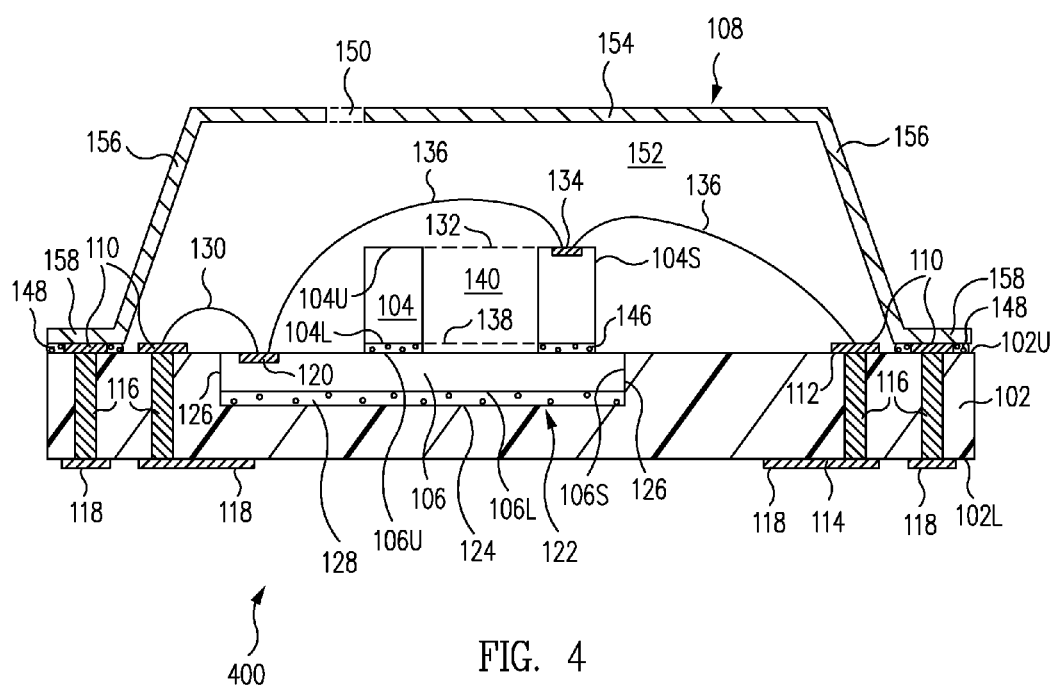

FIG. 4 is cross-sectional view of a stacked die MEMS package 400 in accordance with another embodiment. Stacked die MEMS package 400 of FIG. 4 is similar to staggered die MEMS package 100 of FIG. 1 and only the significant differences are discussed below.

Referring now to FIG. 4, in accordance with this embodiment, MEMS electronic component 104 is mounted only to converter electronic component 106 in a stacked die arrangement. More particularly, lower surface 104L of MEMS electronic component 104 is mounted to active surface 106U of converter electronic component 106, e.g., with adhesive 146. In one embodiment, MEMS electronic component 104 is mounted to converter electronic component 106 inward of bond pads 120 to allow bond wires 130 to be connected therewith.

Further, substrate 102 is formed without bottom port 142. Optionally, lid 108 is formed with top port 150.

However, in another embodiment where access to the ambient environment is not necessary or desired, lid 108 is formed without top port 150 such that lid cavity 152 is a sealed cavity that is sealed from the ambient environment. For example, MEMS electronic component 104 is an inertial sensor such as an accelerometer, a gyroscope, or other MEMS device that does not require access to the ambient environment for proper operation.

Figure 5:
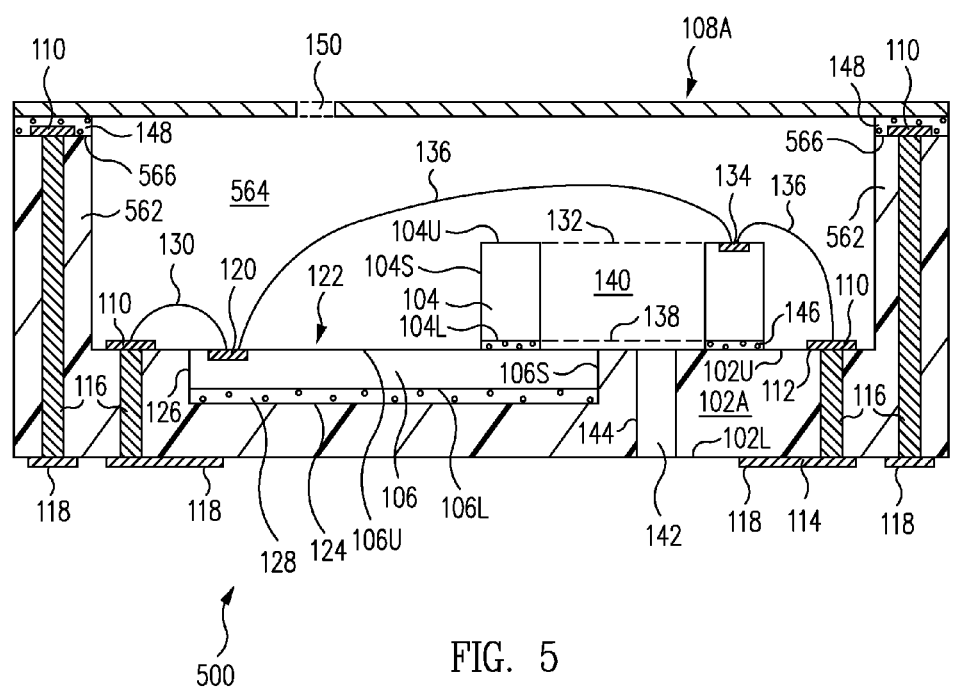
FIG. 5 is cross-sectional view of a staggered die MEMS package in accordance with another embodiment.

FIG. 5 is cross-sectional view of a staggered die MEMS package 500 in accordance with another embodiment. Staggered die MEMS package 500 of FIG. 5 is similar to staggered die MEMS package 100 of FIG. 1 and only the significant differences are discussed below.

In accordance with this embodiment, staggered die MEMS package 500 includes a flat lid 108A. Staggered die MEMS package 500 further includes a cavity substrate 102A similar to substrate 102 of MEMS packages 100, 200, 300, 400 as described above.

However, in accordance with this embodiment, cavity substrate 102A includes sidewalls 562 extending upwards from upper surface 102U of substrate 102A. Upper surface 102U and sidewalls 562 form a cup shaped enclosure defining a substrate cavity 564.

Sidewalls 562 extend upwards to and include a lid mounting surface 566, e.g., a rectangular annular surface. Flat lid 108A is mounted to lid mounting surface 566 by lid adhesive 148 thus sealing substrate cavity 564.

In one embodiment, flat lid 108A is or includes an electrically conductive material to provide RF shielding or more generally to provide shielding from EMI. In accordance with this embodiment, lid adhesive 148 is electrically conductive, e.g., is an electrically conductive epoxy, solder, or other electrically conductive adhesive. Flat lid 108A is mounted to and electrically connected by lid adhesive 148 to terminals 110 on lid mounting surfaces 566. In one embodiment, a reference voltage source, e.g., ground, is provided to terminals 110 and thus flat lid 108A.

However, in other embodiments, flat lid 108A and lid adhesive 148 are non-conductive and lid mounting surface 566 is formed without terminals 110.

Flat lid 108A further includes optional top port 150. More particularly, top port 150 is in fluid communication with substrate cavity 564 and thus diaphragm 132 of MEMS electronic component 104. Accordingly, during use, sound travels through top port 150 and substrate cavity 564 and moves diaphragm 132. As described above, the motion of diaphragm 132 from the sound is converted into an electrical signal that is output on bond pads 134.

Although staggered die MEMS package 500 of FIG. 5 is described as including cavity substrate 102A and flat lid 108A, in other embodiments, MEMS packages 100, 200, 300, 400 of FIGS. 1, 2, 3, 4, respectively, are formed with cavity substrate 102A and flat lid 108A instead of substrate 102 and lid 108 as those of skill in the art will understand in light of this disclosure.

Figure 6:
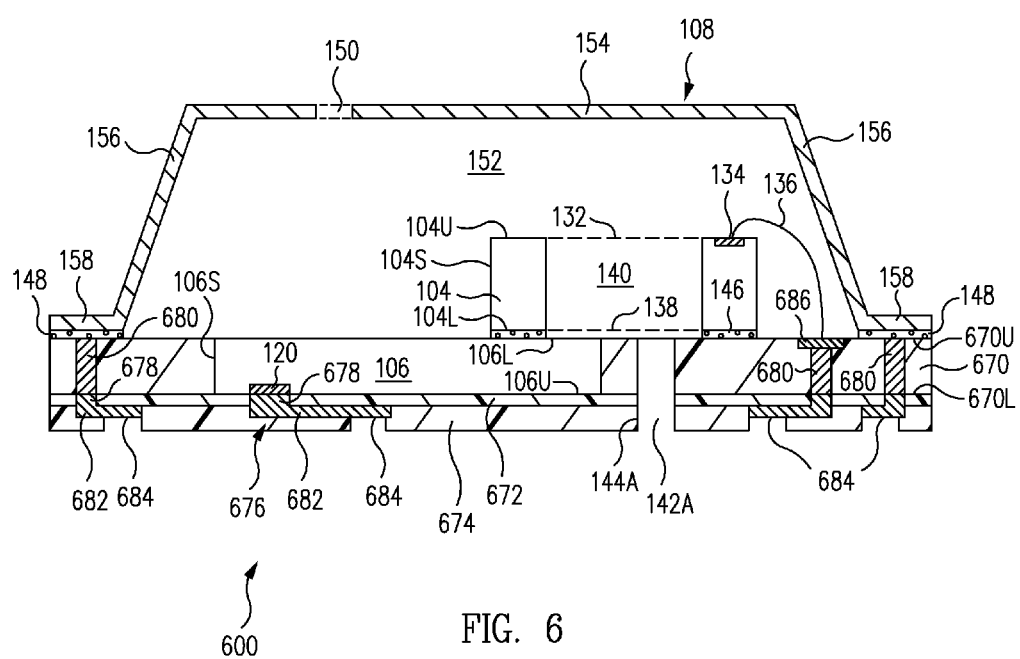
FIG. 6 is a cross-sectional view of a WLFO staggered die MEMS package in accordance with another embodiment.

FIG. 6 is a cross-sectional view of a Wafer Level Fan Out (WLFO) staggered die MEMS package 600 in accordance with another embodiment. WLFO staggered die MEMS package 600 of FIG. 6 is similar to staggered die MEMS package 200 of FIG. 2 and only the significant differences are discussed below.

In accordance with this embodiment, WLFO staggered die MEMS package 600 includes a dielectric package body 670 including an upper, e.g., first, surface 670U and an opposite lower, e.g., second, surface 670L. WLFO staggered die MEMS package 600 further includes one or more dielectric buildup layers 672, 674, and a buildup circuit pattern 676.

Upper surface 670U and lower surface 670L of package body 670 are parallel to and coplanar with inactive surface 106L and active surface 106U of converter electronic component 106, respectively.

Illustratively, converter electronic component 106 is mounted active surface 106U down to a carrier. Converter electronic component 106 (which may be one of a plurality of converter electronic components 106 mounted to the carrier) is then overmold in a dielectric material to form a reconstituted wafer, sometimes called a molded WLFO wafer. In one embodiment, the dielectric material is backgrinded to expose inactive surface 106L of converter electronic component 106 thus forming package body 670 contacting sides 106S of converter electronic component 106. The reconstituted wafer is removed from the carrier to expose active surface 106U including bond pads 120 of converter electronic component 106 and lower surface 670L of package body 670.

Buildup layer 672 is mounted to active surface 106U and lower surface 670L of package body 670. Via apertures are formed in buildup layer 672 and filled with an electrically conductive material to form electrically conductive vias 678 of buildup circuit pattern 676. Vias 678 are electrically connected to vias 680 extending through package body 670 and also to bond pads 120 of converter electronic component 106. Vias 680 extending through package body 670 may be formed at earlier or later stages during fabrication.

Traces 682 of buildup circuit pattern 676 are formed on or embedded within buildup layer 672 and are electrically connected to vias 678. In one embodiment, traces 682 and vias 678 are formed at the same time, e.g., in a plating operation.

Buildup layer 674 is formed on and covers buildup layer 672. Buildup layer 674 is also formed on and covers traces 682 except that buildup layer 674 has openings formed therein that expose lands 684 of traces 682. Although two buildup layers 672, 674 and a particular buildup circuit pattern 676 are illustrated and described above, in light of this disclosure, those of skill in the art will understand that more or less buildup layers, and different circuit patterns can be formed depending upon the particular application, e.g., depending upon the electrical redistribution desired.

Optionally, formed at or embedded within upper surface 670U of package body 670 are terminals 686. Terminals 686 are electrically connected to vias 680.

WLFO staggered die MEMS package 600 further includes an optional bottom port 142A. Bottom port 142A is an aperture, sometimes called opening or hole, extending through substrate 670 and buildup layers 672, 674. Bottom port 142A is defined by a bottom port sidewall 144A, e.g., a cylindrical sidewall, extending through substrate 670 and buildup layer 672, 674. Bottom port 142A is located adjacent to converter electronic component 106.

MEMS electronic component 104 is mounted to both package body 670 and converter electronic component 106 in a staggered die arrangement. More particularly, lower surface 104L of MEMS electronic component 104 is mounted to upper surface 670U of package body 670 and inactive surface 106L of converter electronic component 106, e.g., with adhesive 146.

MEMS electronic component 104 is mounted to substrate 670 above bottom port 142A. More particularly, bottom port 142A is in fluid communication with aperture 140 of MEMS electronic component 104. Accordingly, during use, sound travels through bottom port 142A and aperture 140 and moves diaphragm 132. As described above, the motion of diaphragm 132 from the sound is converted into an electrical signal that is output on bond pads 134.

Bond pads 134 are electrically connected to terminals 686 by bond wires 136. Terminals 686 are formed to facilitate electrically interconnection with bond wires 136. However, in another embodiment, terminals 686 are not formed and bond wires 136 are directly connected to vias 680.

Lid 108 is mounted to upper surface 670U of package body 670 with lid adhesive 148. Illustratively, lid 108 is mounted to and electrically connected by lid adhesive 148 to vias 680 (or terminals 686 connected to vias 680). In one embodiment, a reference voltage source, e.g., ground, is provided to terminals vias 680 and thus lid 108.

As set forth above, WLFO staggered die MEMS package 600 is formed without a substrate or use of a die attach process thus simplifying manufacturing as well as reducing cost while at the same time minimizing total package height and width.

Figure 7:
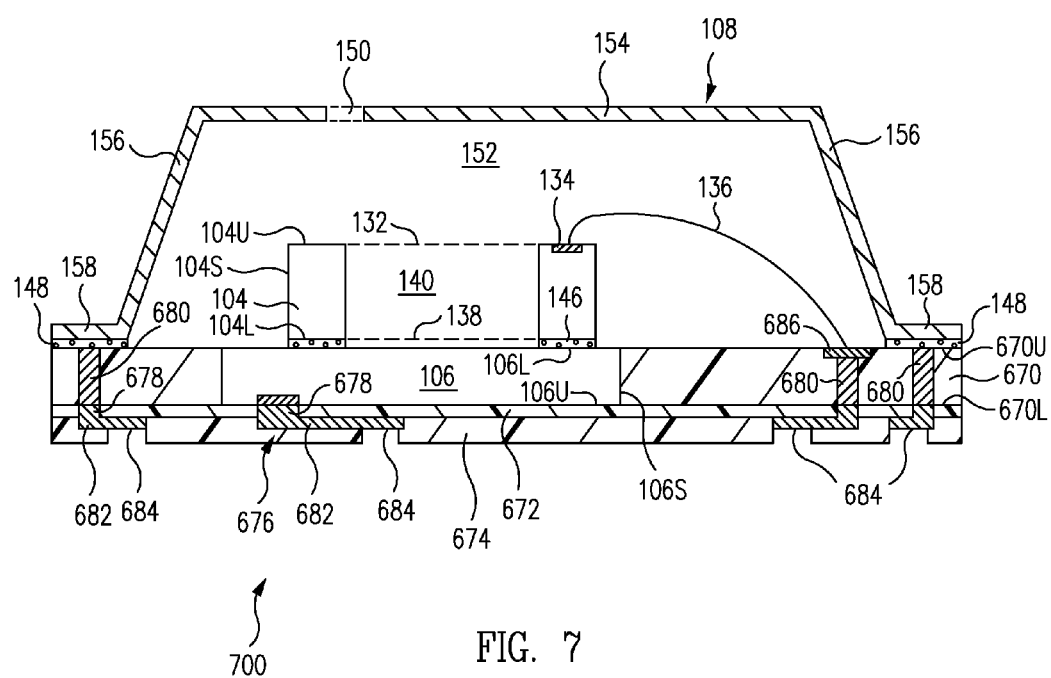
FIG. 7 is cross-sectional view of a WLFO stacked die MEMS package in accordance with another embodiment.

FIG. 7 is cross-sectional view of a WLFO stacked die MEMS package 700 in accordance with another embodiment. WLFO stacked die MEMS package 700 of FIG. 7 is similar to WLFO staggered die MEMS package 600 of FIG. 6 and only the significant differences are discussed below.

Referring now to FIG. 7, in accordance with this embodiment, MEMS electronic component 104 is mounted only to converter electronic component 106 in a stacked die arrangement. More particularly, lower surface 104L of MEMS electronic component 104 is mounted to inactive surface 106L of converter electronic component 106, e.g., with adhesive 146.

Further, package body 670 is formed without bottom port 142A. Optionally, lid 108 is formed with top port 150.

However, in another embodiment where access to the ambient environment is not necessary or desired, lid 108 is formed without top port 150 such that lid cavity 152 is a sealed cavity that is sealed from the ambient environment. For example, MEMS electronic component 104 is an inertial sensor such as an accelerometer, a gyroscope, or other MEMS device that does not require access to the ambient environment for proper operation.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. A packaging comprising:
   a substrate comprising a converter cavity defined between a first surface of the substrate and a second surface of the substrate opposite the first surface;
   a converter electronic component within the converter cavity; and
   a Micro Electro Mechanical Systems (MEMS) electronic component coupled to the converter electronic component and to the first surface of the substrate, and located outside the converter cavity;
   wherein a depth of the converter cavity is configured to contain a total thickness of the converter electronic component when the converter electronic component is mounted within the packaging.

2. The package of claim 1 wherein the converter cavity is defined by a converter cavity base and converter cavity sidewalls.

3. The package of claim 1 further comprising: a lid coupled to the substrate.

4. The package of claim 1, wherein:
   a first portion of a surface of the MEMS electronic component is mounted to a surface of the converter electronic component; and
   a second portion of the surface of the MEMS electronic component is mounted to the first surface of the substrate.

5. The package of claim 2 wherein the converter cavity base is located between planes defined by the first surface and the second surface such that the converter electronic component is located between the converter cavity base and the first surface.

6. The package of claim 2 further comprising an adhesive mounting an inactive surface of the converter electronic component to the converter cavity base.

7. The package of claim 2 further comprising:
   terminals on the converter cavity base; and
   flip chip bumps coupling bond pads on an active surface of the converter electronic component to the terminals.

8. The package of claim 3 wherein the substrate comprises:
   sidewalls extending upward from the first surface of the substrate, the sidewalls comprising a lid mounting surface, the lid being coupled to the lid mounting surface.

9. The package of claim 3 wherein the lid comprises a top port.

10. The package of claim 5 wherein the converter cavity sidewalls extend between the converter cavity base and the first surface.

11. The package of claim 6 wherein the MEMS electronic component is coupled to an active surface of the converter electronic component, the active surface comprising bond pads thereon.

12. The package of claim 7 wherein the MEMS electronic component is coupled to an inactive surface of the converter electronic component.

13. The package of claim 11 wherein the MEMS electronic component is further mounted to the first surface of the substrate.

14. The package of claim 12 wherein the MEMS electronic component is mounted to a first surface of the substrate utilizing an adhesive.

15. The package of claim 13 wherein the MEMS electronic component is coupled to the first surface of the substrate and above a bottom port extending through the substrate.

16. The package of claim 14 wherein the MEMS electronic component is coupled to the first surface above a bottom port extending through the substrate.

17. A package comprising:
   a converter electronic component comprising:
      an active surface;
      an inactive surface; and
      sides;
   a package body contacting the sides, the package body comprising:
      a first surface parallel to and coplanar with the inactive surface; and
      a second surface parallel to and coplanar with the active surface;
   a Micro Electro Mechanical Systems (MEMS) electronic component coupled to the converter electronic component; and
   a lid coupled to the first surface of the package body and defining a cavity in which the MEMS electronic component is enclosed.

18. The package of claim 17 wherein a first portion of a surface of the MEMS electronic component is mounted to the inactive surface of the converter electronic component.

19. The package of claim 18 wherein a second portion of the surface of the MEMS electronic component is mounted to the first surface of the package body above a bottom port extending through the package body.

20. A method comprising:
   forming a substrate comprising a converter cavity defined between a first surface of the substrate and a second surface of the substrate opposite the first surface;
   mounting a converter electronic component within the converter cavity; and
   coupling a Micro Electro Mechanical Systems (MEMS) electronic component to the converter electronic component and to the first surface of the substrate, and located outside the converter cavity;
   wherein forming the substrate comprises configuring a depth of the converter cavity to contain a total thickness of the converter electronic component when the converter electronic component is mounted within the packaging.

21. The method of claim 20 further comprising coupling the MEMS electronic component such that:
   a first portion of a surface of the MEMS electronic component is mounted to a surface of the converter electronic component; and
   a second portion the surface of the MEMS electronic component is mounted to the first surface of the substrate.

* * * * *